United States Patent
Park et al.

(10) Patent No.: US 8,115,264 B2
(45) Date of Patent: Feb. 14, 2012

(54) SEMICONDUCTOR DEVICE HAVING A METAL GATE WITH A LOW SHEET RESISTANCE AND METHOD OF FABRICATING METAL GATE OF THE SAME

(75) Inventors: Sung-ho Park, Yongin-si (KR); Jin-seo Noh, Seongnam-si (KR); Joong S. Jeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 695 days.

(21) Appl. No.: 12/007,431

(22) Filed: Jan. 10, 2008

(65) Prior Publication Data
US 2009/0065873 A1 Mar. 12, 2009

(30) Foreign Application Priority Data

Sep. 6, 2007 (KR) .................. 10-2007-0090553

(51) Int. Cl.
*H01L 29/78* (2006.01)
(52) U.S. Cl. ........ 257/412; 257/407; 257/767; 257/768; 257/770; 257/771; 257/E21.635; 257/E29.134; 257/E29.139; 257/E29.157; 257/E29.158; 257/E29.159; 257/E29.16; 438/627
(58) Field of Classification Search .............. 438/627; 257/E21.635, E29.134, E29.139, E29.157, 257/E29.158, E29.159, E29.16, 407, 412, 257/767, 768, 770, 771
See application file for complete search history.

(56) References Cited

U.S. PATENT DOCUMENTS

| 5,796,166 A * | 8/1998 | Agnello et al. ............... 257/751 |
| 6,861,350 B1 * | 3/2005 | Ngo et al. ..................... 438/627 |
| 2002/0001906 A1 * | 1/2002 | Park ............................. 438/287 |
| 2002/0086504 A1 * | 7/2002 | Park et al. .................... 438/580 |

OTHER PUBLICATIONS

Yong Ju Lee and Sang-Won Kang, Controlling the composition of Ti1-xAlxN thin films by modifying the number of TiN and AlN subcycles in atomic layer deposition, Aug. 14, 2003, J.Vac. Sci. Technol. A 21(5), L13-L15.*

* cited by examiner

*Primary Examiner* — Kenneth Parker
*Assistant Examiner* — David Chen
(74) *Attorney, Agent, or Firm* — Harness, Dickey & Pierce, P.L.C.

(57) ABSTRACT

Provided is a semiconductor device that comprises a metal gate having a low sheet resistance characteristic and a high diffusion barrier characteristic and a method of fabricating the metal gate of the semiconductor device. The semiconductor device includes a metal gate formed on a gate insulating film, wherein the metal gate is formed of a metal nitride that contains Al or Si and includes upper and lower portions where the content of Al or Si is relatively high and a central portion where the content of Al or Si is relatively low.

16 Claims, 5 Drawing Sheets

SEMICONDUCTOR DEVICE HAVING A METAL GATE WITH A LOW SHEET RESISTANCE AND METHOD OF FABRICATING METAL GATE OF THE SAME

CROSS-REFERENCE TO RELATED PATENT APPLICATION

This application claims the benefit of Korean Patent Application No. 10-2007-0090553, filed on Sep. 6, 2007, in the Korean Intellectual Property Office, the disclosure of which is incorporated herein in its entirety by reference.

BACKGROUND OF THE INVENTION

1. Field of the Invention

The present invention relates to a semiconductor device and a method of fabricating a metal gate of the semiconductor device, and more particularly, to a complementary metal oxide semiconductor (CMOS) device having a low sheet resistance characteristic and a high diffusion barrier characteristic and a method of fabricating a metal gate of the CMOS device.

2. Description of the Related Art

A complementary metal oxide semiconductor (CMOS) device formed to be complementarily operated includes a p-channel metal oxide semiconductor (PMOS) transistor and an n-channel metal oxide semiconductor (NMOS) transistor. Such CMOS devices have increased efficiency and operation speed and also can have characteristics similar to a bipolar transistor. Thus, the CMOS devices are used as high speed and high performance devices.

In the prior art, a gate of a CMOS device is formed by forming a polysilicon doped to identical type to each channel on a gate insulating film (or a gate oxide film), for example, formed of silicon oxide $SiO_2$. For example, a gate of the PMOS transistor is formed using polysilicon doped with a P-type dopant, and a gate of the NMOS transistor is formed using polysilicon doped with an N-type dopant. However, due to the high integration of the semiconductor devices, thicknesses of thin films in the semiconductor devices are gradually reduced. Thus, as the thickness of the conventional $SiO_2$ thin film used as a gate insulating film is reduced, the leakage current is increased due to tunneling, and thus, power consumption of the CMOS device exceeds a standard value.

In order to address the above problems, studies have been conducted on developing a high dielectric (high-k) oxide film that can realize a gate insulating film electrically having a thickness identical to an equivalent oxide film thickness and physically having a thickness greater than a thickness that does not cause tunneling. As a result, $SiO_2$ has been replaced with a high-k material such as $HfO_2$ or $Al_2O_3$. However, when the high-k material is used as the gate insulating film, impurities included in the doped polysilicon formed on the gate insulating film are diffused into the gate insulating film.

Therefore, in order to address the diffusion problem, recently, studies have been conducted to use a metal as the gate instead of the doped polysilicon. The metal gate is also believed to decrease the high sheet resistance problem of conventional polysilicon. However, if a pure metal is used to obtain low sheet resistance, the diffusion problem still remains. Thus, attempts to use a metal compound such as TiN or TaN instead of a pure metal have been conducted. However, TiN and TaN are easily oxidized since TiN and TaN are highly oxidative. Also, problems of thermal stability and diffusion into the gate insulating film still remain.

SUMMARY OF THE INVENTION

To address the above and/or other problems, the present invention provides a method of fabricating semiconductor device, in particular, a complementary metal oxide semiconductor (CMOS) having a low sheet resistance characteristic and a diffusion barrier characteristic.

The present invention also provides a semiconductor device, in particular, a CMOS device comprising a metal gate that has a low sheet resistance characteristic and a diffusion barrier characteristic.

According to an aspect of the present invention, there is provided a semiconductor device comprising a metal gate formed on a gate insulating film, wherein the metal gate is formed of a metal nitride containing Al or Si and comprises upper and lower portions where the content of Al or Si is relatively high and a central portion where the content of Al or Si is relatively low.

The metal nitride that comprises Al or Si may be one selected from the group consisting of TiAlN, TaSiN, and TaAlN.

The content of Al or Si may gradually decrease from the lower portion to the central portion of the metal gate, and the content of Al or Si may gradually increase from the central portion to the upper portion of the metal gate.

The content of Al or Si may decrease in a stepwise manner from the lower portion to the central portion of the metal gate, and the content of Al or Si increases in a stepwise manner from the central portion to the upper portion of the metal gate.

The content of Al or Si in the lower portion and the upper portion of the metal gate may be in a range from 30 to 40 at %, and the content of Al or Si in the central portion of the metal gate may be in a range from 0 to 20 at %.

The metal gate may be formed using an atomic layer deposition (ALD) process, and the content of Al or Si in the metal gate may be controlled by controlling the ratio of deposition cycle of the ALD process.

The semiconductor device may be a CMOS device that comprises a PMOS transistor and an NMOS transistor that respectively may comprise metal gates having work functions different from each other.

According to another aspect of the present invention, there is provided a method of fabricating a semiconductor device, comprising: forming a gate insulating film on a semiconductor substrate; and forming a metal gate on the gate insulating film, wherein the metal gate is formed of a metal nitride containing Al or Si and comprises upper and lower portions where the content of Al or Si is relatively high and a central portion where the content of Al or Si is relatively low.

If the metal gate is formed of TiAlN, the metal gate may be formed by alternately depositing a TiN layer and an AlN layer using an ALD process, and the content of Al in the metal gate may be controlled by controlling the ratio of deposition cycle of the TiN layer to the AlN layer.

The TiN layer may be deposited using $Ti[N(CH_3)_2]_4$ as a precursor and a plasma applied $NH_3$ gas as a reaction gas by an ALD process, and the AlN layer may be deposited using $Al(CH_3)_3$ as a precursor and a plasma applied $NH_3$ gas as a reaction gas by an ALD process.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A semiconductor device that includes a metal gate having a low sheet resistance characteristic and a diffusion barrier characteristic according to the present invention and a method of fabricating the metal gate of the semiconductor device will now be described more fully with reference to the accompanying drawings in which exemplary embodiments of the invention are shown.

Figure 1:
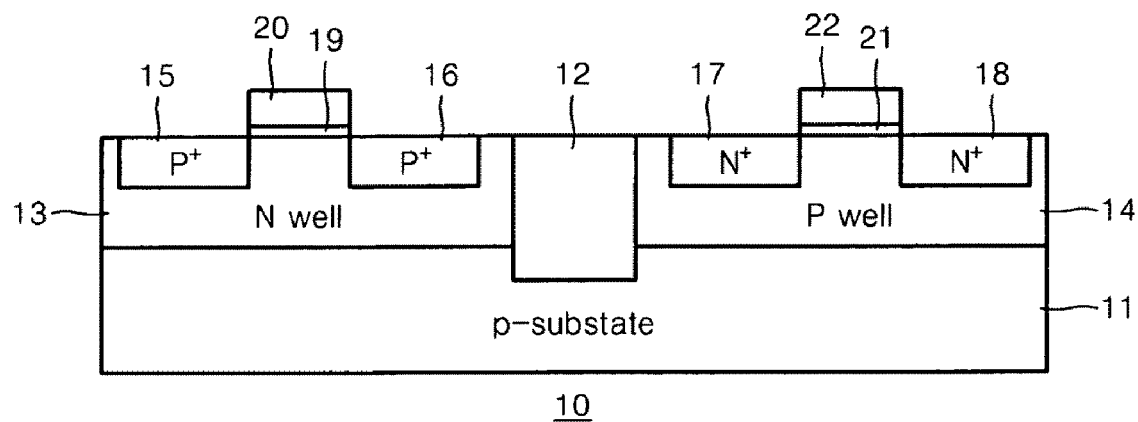
FIG. 1 is a schematic cross-sectional view of the structure of a CMOS device that includes a metal gate having different work functions.

FIG. 1 is a schematic cross-sectional view of the structure of a complementary metal oxide semiconductor (CMOS) device 10 that includes a p-channel metal oxide semiconductor (PMOS) transistor and an n-channel metal oxide semiconductor (NMOS) transistor. Referring to FIG. 1, the CMOS device 10 includes a PMOS transistor and an NMOS transistor respectively formed on a P-type substrate 11. In FIG. 1, the PMOS transistor is depicted in a left side of the drawing and the NMOS transistor is depicted in a right side of the drawing. A field oxide film 12 is formed between the PMOS transistor and the NMOS transistor to electrically separate the PMOS transistor from the NMOS transistor.

The PMOS transistor includes an N-type well layer 13, a gate insulating film 19 formed on a central upper surface of the N-type well layer 13, a metal gate 20 formed on the gate insulating film 19, and a drain 15 and a source 16 which are respectively doped with a P+ dopant and formed in either side of the gate insulating film 19 on the N-type well layer 13. The NMOS transistor includes a P-type well layer 14, a gate insulating film 21 formed on a central upper surface of the P-type well layer 14, a metal gate 22 formed on the gate insulating film 21, and a drain 17 and a source 18 which are respectively doped with an N+ dopant and are formed in both sides of the gate insulating film 21 on the P-type well layer 14.

The gate insulating films 19 and 21 can be formed of a high dielectric material such as $HfO_2$ or $Al_2O_3$. Alternatively, the gate insulating films 19 and 21 can be formed in a multiple layer structure that includes a high dielectric material layer and a $SiO_2$ layer.

If a metal is used as a gate in the CMOS device 10 having the above structure, gate metals respectively having work functions different from each other are used in the PMOS transistor and the NMOS transistor in order to achieve a desired level of threshold voltages of the PMOS transistor and the NMOS transistor. Generally, it is preferable that the metal gate 20 of the PMOS transistor have a work function higher than that of the metal gate 22 of the NMOS transistor. For example, it is appropriate that the metal gate 20 of the PMOS transistor has a work function of 4.9 eV, and the metal gate 22 of the NMOS transistor has a work function of 4.2 eV. In particular, the present invention is to obtain a low sheet resistance characteristic and a high diffusion barrier characteristic in the metal gate 20 of the PMOS transistor that has a relatively high work function.

Figure 2:
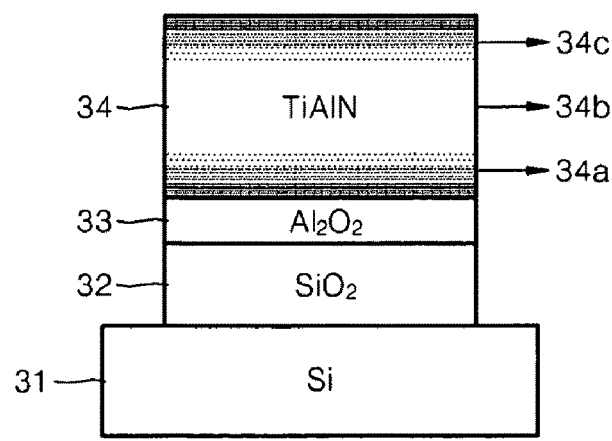
FIG. 2 is a schematic cross-sectional view of the structure of a metal gate of a semiconductor device according to an embodiment of the present invention.

In order to achieve the above purposes, a structure of a metal gate according to an embodiment of the present invention is shown in FIG. 2. Referring to FIG. 2, for experimental convenience, a $SiO_2$ layer 32 and an $Al_2O_3$ layer 33 as gate insulating layers are formed on a semiconductor substrate 31 formed of silicon Si, and a metal gate 34 is formed on the $Al_2O_3$ layer 33. The metal gate 34 of FIG. 2 can be formed of a metal nitride, for example, TiAlN, TaSiN, or TaAlN. In particular, the metal gate 34 can include a lower portion 34a and an upper portion 34c in which the content of Al or Si is relatively high and a central portion 34b in which the content of Al or Si is relatively low.

As described above, a metal nitride such as TiN or TaN has been conventionally used for fabricating a metal gate. However, there are problems in that the metal nitride is readily oxidized due to highly oxidativeness of the metal nitride, is thermally instable, and diffuses into the gate insulating film. A metal nitride thin film that contains an atom, for example, Al or Si having small in size, such as TiAlN thin film, a TaSiN thin film, or a TaAlN thin film, is used in actual semiconductor processes as a diffusion barrier for preventing the diffusion of the metal nitride into a gate insulating film. However, the metal nitride thin film such as the TiAlN thin film, the TaSiN thin film, or the TaAlN thin film has high sheet resistance. The present invention is to prevent the metal nitride from being diffused into the gate insulating film by using a metal nitride material having a high diffusion barrier characteristic at interfaces 34a and 34c of the metal gate 34, and to secure a low sheet resistance characteristic by using a metal nitride having low sheet resistance in a central portion of the metal gate 34.

The metal gate 34 having the above structure can be formed using, for example, an atomic layer deposition (ALD) process by controlling the ratio of Al or Si. For example, in the case of forming the metal gate 34 using TiAlN, the TiAlN layer can be formed by alternately depositing a TiN layer and an AlN layer using an ALD process. At this point, the content of Al in the TiAlN layer can be controlled by controlling the ratio of deposition cycle of the TiN layer to the AlN layer. More specifically, the TiN layer can be deposited layer by layer by an ALD process using TDMAT(Ti[N(CH$_3$)$_2$]$_4$) as a precursor and a plasma applied NH$_3$ gas as a reaction gas. The AlN layer can be deposited layer by layer by an ALD process using TMA(Al(CH$_3$)$_3$) as a precursor and a plasma applied NH$_3$ gas as a reaction gas. At this point, the content of Al in the TiAlN layer can be controlled by controlling the ratio of deposition cycle of the TiN layer to the AlN layer in the ALD process.

Then, the content of Al in the metal gate 34 formed of TiAlN can be gradually reduced from the lower portion 34a to the central portion 34b of the metal gate 34, and the content of Al in the metal gate 34 can be gradually increased from the central portion 34b to the upper portion 34c of the metal gate 34. Instead of gradually changing the content of Al in the metal gate 34, the content of Al in the metal gate 34 can be changed in a stepwise manner such that the content of Al in the lower portion 34a, the central portion 34b, and the upper portion 34c can be clearly distinguished. For example, the content of Al (Al/(Al+Ti)) in the lower portion 34a and the upper portion 34c of the metal gate 34 can be in a range from 30 to 40 at %, and the content of Al (Al/(Al+Ti)) in the central portion 34b of the metal gate 34 can be in range from 0 to 20 at %. These ratios can also be applied when TaSiN or TaAlN is used instead of TiAlN.

Figure 3:
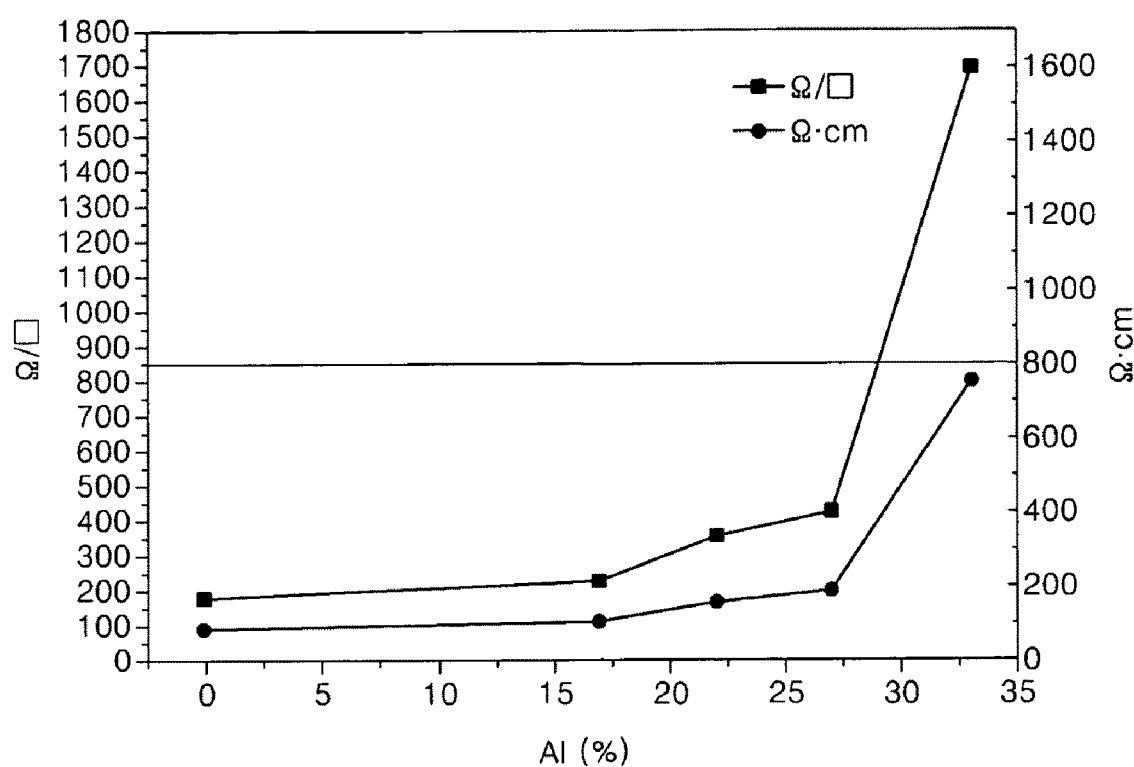
FIG. 3 is a graph showing the variation of resistance according to the increase in Al in a TiAlN thin film.

FIG. 3 is a graph showing the variation of resistance according to the increase in Al in TiAlN in the metal gate 34 according to an embodiment of the present invention. In FIG. 3, symbol-■-indicates sheet resistance Ω/□ of the metal gate 34, and symbol-●-indicates specific resistance Ω·cm of the metal gate 34. The content (at %) of Al was calculated from the number of Al atoms with respect to the number of Al+Ti atoms. As shown in FIG. 3, both the sheet resistance and the specific resistance of the metal gate 34 increase with the increase in the Al content.

In this manner, if a small Al atom or a Si atom is included in TiN or TaN, the Al atom or the Si atom can enter a lattice of TiN or TaN without changing the lattice shape of TiN or TaN. Thus, the low sheet resistance characteristic at the central portion 34b of the metal gate 34 can be maintained by not including Al or Si, and the diffusion barrier characteristic can be increased at the lower portion 34a and the upper portion 34c of the metal gate 34 by increasing Al or Si.

Also, the metal gate 34 according to an embodiment of the present invention can increase thermal stability as compared to a conventional metal gate. In order to prove the thermal stability of the metal gate 34, the thermal stability test was performed by manufacturing a TiAlN metal gate specimen (specimen 1) in which Al is uniformly distributed and a TiAlN metal gate specimen (specimen 2) according to an embodiment of the present invention. The specimen 1 has a thickness of approximately 200 Å and has an Al content (Al/(Al+Ti)) of approximately 14.9 at %. The specimen 2 also has an overall thickness of approximately 200 Å in which a lower portion and an upper portion respectively have a thickness of approximately 50 Å and a central portion has a thickness of approximately 100 Å. The Al content (Al/(Al+Ti)) in the lower portion and the upper portion was approximately 45 at %, and that of the central portion is approximately 0 at %. An average Al content in the specimen 2 was approximately 19.8 at %, which is greater than that of the specimen 1.

Figure 4:
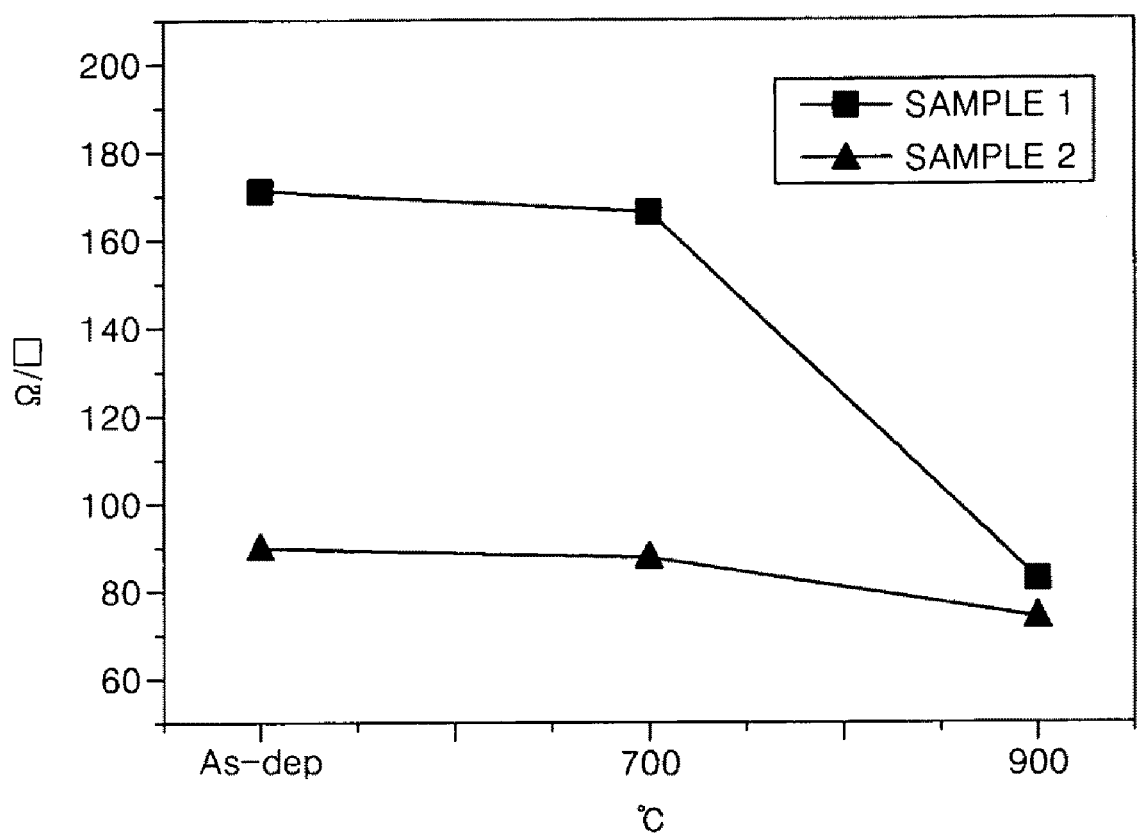
FIG. 4 is a graph showing the comparison of thermal stability between a TiAlN thin film specimen in which Al is uniformly distributed and a metal gate specimen according to the present invention.

FIG. 4 is a graph showing sheet resistances of the specimens 1 and 2 manufactured as described above. In FIG. 4, the sheet resistances when the specimens 1 and 2 are un-annealed, annealed at a temperature of 700° C., and annealed at a temperature of 900° C. are shown. Referring to FIG. 4, the specimen 2 shows a sheet resistance lower than the specimen 1 although the specimen 2 has the average Al content of 19.8 at % which is greater than that of the specimen 1 which has the Al content of 14.9 at %. In particular, in the un-annealed state, the sheet resistance of the specimen 2 is lower than that of the specimen 1 by more than twice. Furthermore, the specimen 2 according to the present invention maintains nearly constant sheet resistance after annealing, however, in the case of the specimen 1, the sheet resistance was rapidly reduced when the specimen 1 was annealed at a temperature of 900° C.

Figure 5:
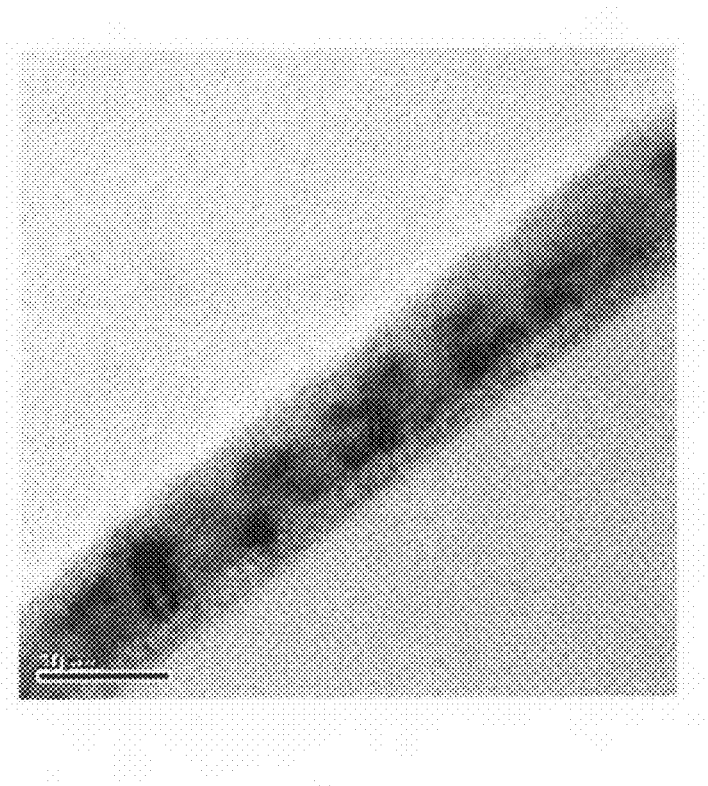
FIGS. 5 and 6 are transmission electron microscopy (TEM) photo images of a metal gate specimen before and after annealing the metal gate specimen according to an embodiment of the present invention.
Figure 6:
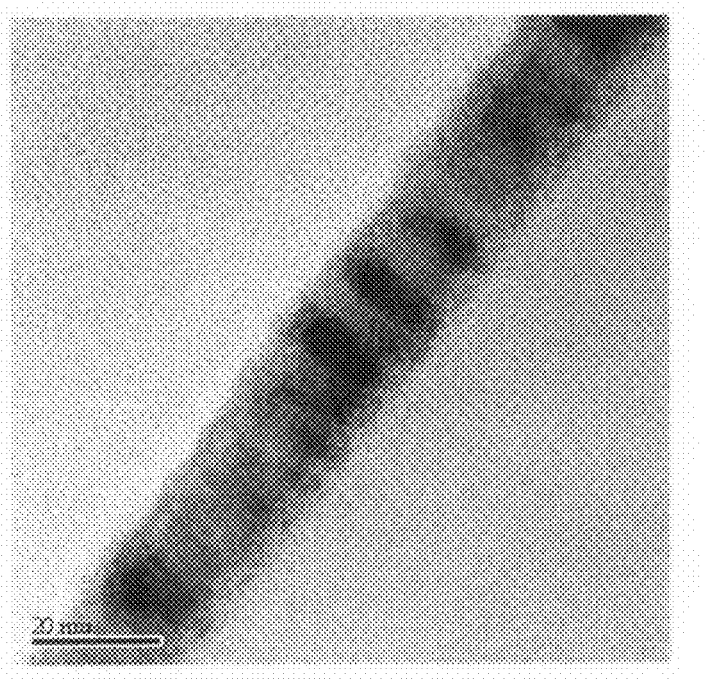

FIGS. 5 and 6 are transmission electron microscopy (TEM) photo images of the specimen 2 according to the present invention. FIG. 5 shows a TEM photo image of the specimen 2 before annealing, and FIG. 6 shows a TEM photo image of the specimen 2 after annealing the specimen 2 at a temperature of 900° C. under an $N_2$ atmosphere. If the TEM photo images of the specimen 2 of FIGS. 5 and 6 are compared, it can be seen that the specimen 2 according to the present invention has nearly no changes before and after annealing. Thus, it can be seen that the metal gate 34 according to an embodiment of the present invention overall has low sheet resistance, high thermal stability, and a high diffusion barrier characteristic.

Figure 7:
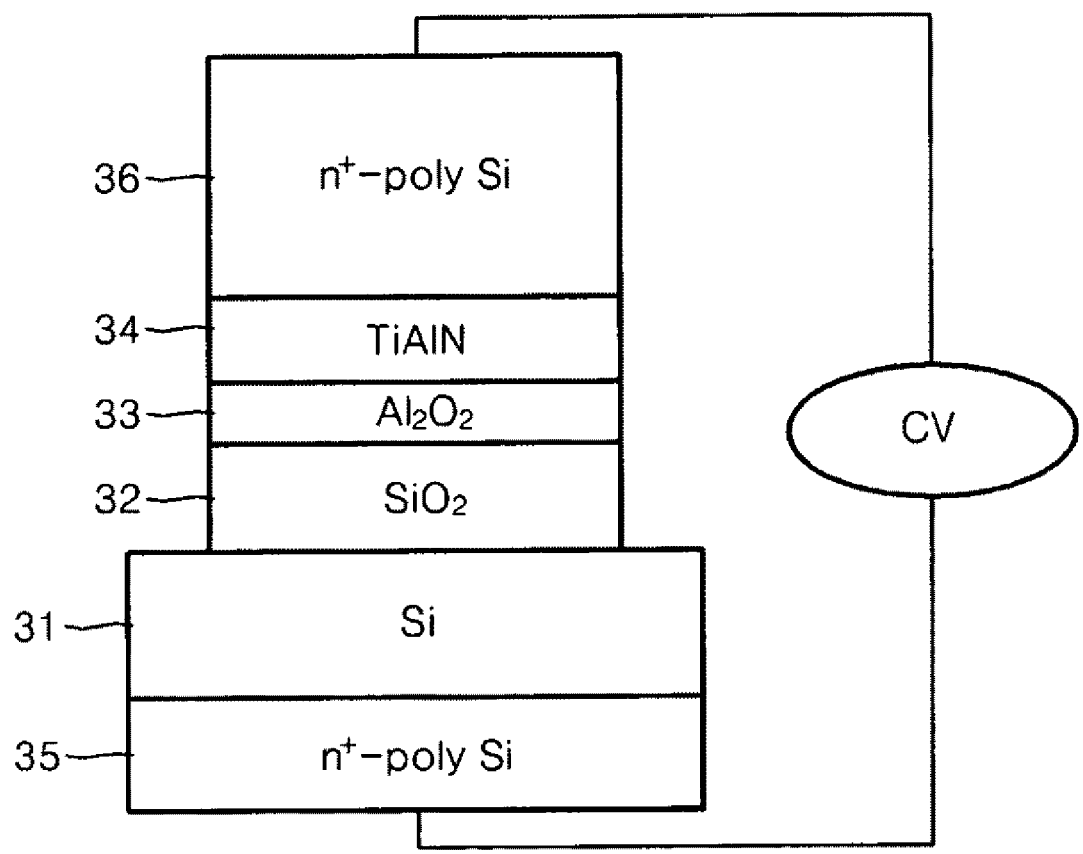
FIG. 7 is a schematic cross-sectional view of a structure for measuring work functions of a metal gate of a semiconductor device according to an embodiment of the present invention.

In order to measure a work function of the metal gate 34 according to an embodiment of the present invention, as depicted in FIG. 7, N+ doped polysilicon layers 35 and 36 are respectively formed in the semiconductor substrate 31 and the metal gate 34 in the structure depicted in FIG. 2. The metal gate 34 was the same material used for forming the specimen 2 described above. Afterwards, a capacitance-voltage characteristic was measured by applying a voltage to both ends of the N+ doped polysilicon layers 35 and 36. At this point, the capacitance-voltage characteristic was measured by changing the thickness of the $SiO_2$ layer 32 from approximately 100 Å to 125 Å to calculate a flat band voltage Vfb. From the measurement result, it can be confirmed that the work function of the metal gate 34 was approximately 4.95 eV using a well-known Vfb(Y)-Tox(x) plot method.

Thus, it can be seen that the metal gate 34 according to the present invention can be applied to a metal gate for a PMOS transistor of a CMOS device 10 that requires high work function. Also, the metal gate 34 according to the present invention can be applied to a gate of all semiconductor devices that require high work function in addition to the PMOS transistor of a CMOS device. For example, if the metal gate 34 is used in a metal gate of a flash memory, the electron injection phenomenon that occurs in a gate of the flash memory can be improved, and thus, a data retention characteristic of a flash memory can be increased.

According to the present invention, low sheet resistance of a metal gate can be secured in a central portion of the metal gate where, for example, a TiAlN thin film having a low Al content is formed, and a high diffusion barrier characteristic of the metal gate can be secured at interfaces of the metal gate where, a TiAlN thin film having a high Al content is formed. Accordingly, in a semiconductor device, in particular, in a CMOS device, a metal gate having both low sheet resistance and high diffusion barrier characteristic can be provided.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
a metal gate formed on a gate insulating film,
wherein the metal gate is formed of a metal nitride containing Al or Si and comprises upper and lower portions where the content of Al or Si is relatively high and a central portion where the content of Al or Si is relatively low, and
the lower portion directly contacts the gate insulating film on a semiconductor substrate.

2. The semiconductor device of claim 1, wherein the metal nitride that comprises Al or Si is one selected from the group consisting of TiAlN, TaSiN, and TaAlN.

3. The semiconductor device of claim 1, wherein the content of Al or Si gradually decreases from the lower portion to the central portion of the metal gate, and the content of Al or Si gradually increases from the central portion to the upper portion of the metal gate.

4. The semiconductor device of claim 1, wherein the content of Al or Si decreases in a stepwise manner from the lower portion to the central portion of the metal gate, and the content of Al or Si increases in a stepwise manner from the central portion to the upper portion of the metal gate.

5. The semiconductor device of claim 4, wherein the content of Al or Si in the lower portion and the upper portion of the metal gate is in a range from 30 to 40 at %, and the content of Al or Si in the central portion of the metal gate is in a range from 0 to 20 at %.

6. The semiconductor device of claim 1, wherein the metal gate is formed using an atomic layer deposition (ALD) process, and the content of Al or Si in the metal gate is controlled by controlling the ratio of deposition cycle of the ALD process.

7. The semiconductor device of claim 1, wherein the semiconductor device is a CMOS device that comprises a PMOS transistor and an NMOS transistor that respectively comprise metal gates having work functions different from each other.

8. A method of fabricating a semiconductor device, comprising:
   forming a gate insulating film on a semiconductor substrate; and
   forming a metal gate on the gate insulating film,
   wherein the metal gate is formed of a metal nitride containing Al or Si and comprises upper and lower portions where the content of Al or Si is relatively high and a central portion where the content of Al or Si is relatively low, and
   the lower portion directly contacts the gate insulating film on the semiconductor substrate.

9. The method of claim 8, wherein the metal nitride that comprises Al or Si is one selected from the group consisting of TiAlN, TaSiN, and TaAlN.

10. The method of claim 8, wherein the content of Al or Si gradually decreases from the lower portion to the central portion of the metal gate, and the content of Al or Si gradually increases from the central portion to the upper portion of the metal gate.

11. The method of claim 8, wherein the content of Al or Si decreases in a stepwise manner from the lower portion to the central portion of the metal gate, and the content of Al or Si increases in a stepwise manner from the central portion to the upper portion of the metal gate.

12. The method of claim 11, wherein the content of Al or Si in the lower portion and the upper portion of the metal gate is in a range from 30 to 40 at %, and the content of Al or Si in the central portion of the metal gate is in a range from 0 to 20 at %.

13. The method of claim 8, wherein the metal gate is formed using an atomic layer deposition (ALD) process, and the content of Al or Si in the metal gate is controlled by controlling the ratio of deposition cycle of the ALD process.

14. The method of claim 13, wherein, the metal gate is formed by alternately depositing a TiN layer and an AlN layer using an ALD process to form a TiAlN metal gate, and the content of Al in the metal gate is controlled by controlling the ratio of deposition cycle of the TiN layer to the AlN layer.

15. The method of claim 14, wherein the TiN layer is deposited using $Ti[N(CH_3)_2]_4$ as a precursor and a plasma applied $NH_3$ gas as a reaction gas by an ALD process, and the AlN layer is deposited using $Al(CH_3)_3$ as a precursor and a plasma applied $NH_3$ gas as a reaction gas by an ALD process.

16. The method of claim 8, wherein the semiconductor device is a CMOS device that comprises a PMOS transistor and an NMOS transistor that respectively comprise metal gates having work functions different from each other.

* * * * *